(12) United States Patent
Shiau

(10) Patent No.: US 11,545,607 B2
(45) Date of Patent: Jan. 3, 2023

(54) UPPER SUBSTRATE FOR MINIATURE LED COMPONENT, MINIATURE LED COMPONENT, AND MINIATURE LED DISPLAY DEVICE

(71) Applicants: TUNGHSU GROUP CO., LTD., Hebei (CN); TUNGHSU OPTOELECTRONIC TECHNOLOGY CO., LTD., Hebei (CN)

(72) Inventor: Yihau Shiau, Hebei (CN)

(73) Assignees: TUNGHSU GROUP CO., LTD., Shijiazhuang (CN); TUNGHSU OPTOELECTRONIC TECHNOLOGY CO., LTD., Shijiazhuang (CN)

( * ) Notice: Subject to any disclaimer, the term of this patent is extended or adjusted under 35 U.S.C. 154(b) by 415 days.

(21) Appl. No.: 16/768,813

(22) PCT Filed: Dec. 4, 2017

(86) PCT No.: PCT/CN2017/114383
§ 371 (c)(1),
(2) Date: Jun. 1, 2020

(87) PCT Pub. No.: WO2019/109200
PCT Pub. Date: Jun. 13, 2019

(65) Prior Publication Data
US 2021/0111326 A1    Apr. 15, 2021

(51) Int. Cl.
*H01L 33/64*    (2010.01)
*H01L 33/62*    (2010.01)

(52) U.S. Cl.
CPC .......... *H01L 33/641* (2013.01); *H01L 33/62* (2013.01); *H01L 2933/0075* (2013.01)

(58) Field of Classification Search
CPC combination set(s) only.
See application file for complete search history.

(56) References Cited

U.S. PATENT DOCUMENTS

2008/0224153 A1    9/2008  Tomoda
2014/0125935 A1    5/2014  Nakamura et al.
(Continued)

FOREIGN PATENT DOCUMENTS

CN    101197355 A    6/2008
CN    103811528      5/2014
(Continued)

OTHER PUBLICATIONS

Bui et al., "High optical density and low dielectric constant black matrix containing graphene oxide and carbon black on color filters", Displays, 2013, Elsevier B.V., pp. 192-199, vol. 34, No. 3., NL.
(Continued)

*Primary Examiner* — Ratisha Mehta
(74) *Attorney, Agent, or Firm* — Myers Wolin, LLC

(57) ABSTRACT

Provided is an upper substrate for a miniature LED component, a miniature LED component, and a miniature LED display device, wherein the upper substrate for the miniature LED component comprises: a bottom substrate; a metal layer formed on the bottom substrate and having a pattern capable of covering a non-opening region of the lower substrate for the miniature LED component; a graphene layer formed on the bottom substrate; a transparent adhesive layer formed on the bottom substrate to cover the metal layer and the graphene layer.

20 Claims, 8 Drawing Sheets

(56) References Cited

U.S. PATENT DOCUMENTS

| | | |
|---|---|---|
| 2014/0159064 A1 | 6/2014 | Sakariya et al. |
| 2015/0069365 A1 | 3/2015 | Liu et al. |
| 2015/0093842 A1 | 4/2015 | Higginson et al. |
| 2016/0336374 A1* | 11/2016 | Jiang .................. H01L 27/1248 |
| 2018/0088379 A1* | 3/2018 | Fan .................. G02F 1/133621 |
| 2018/0190712 A1 | 7/2018 | Xu et al. |
| 2019/0079306 A1 | 3/2019 | Wang et al. |

FOREIGN PATENT DOCUMENTS

| | | |
|---|---|---|
| CN | 104838508 | 8/2015 |
| CN | 105807475 | 7/2016 |
| CN | 105899053 | 8/2016 |
| CN | 105914200 | 8/2016 |
| CN | 106707533 | 5/2017 |
| CN | 106876406 | 6/2017 |
| CN | 108565324 A | 9/2018 |
| JP | 2008-141026 A | 6/2008 |
| JP | 2009-94181 A | 4/2009 |
| JP | 2012-163699 A | 8/2012 |
| JP | 2013-191685 A | 9/2013 |
| JP | 2014-63033 A | 4/2014 |
| JP | 2015-109331 A | 6/2015 |
| JP | 2016-143630 A | 8/2016 |
| JP | 2017-179047 A | 10/2017 |
| JP | 2017-211651 A | 11/2017 |
| JP | 2017-224675 A | 12/2017 |
| JP | 2019-28308 A | 2/2019 |
| KR | 10-2008-0051044 A | 6/2008 |
| WO | 2014/093063 | 6/2014 |
| WO | 2014/093065 | 6/2014 |
| WO | 2016/200882 | 12/2016 |
| WO | 2018/221081 A1 | 12/2018 |
| WO | 2018/221256 A1 | 12/2018 |

OTHER PUBLICATIONS

International Search Report dated Sep. 7, 2018 in International (PCT) Application No. PCT/CN2017/114383.

\* cited by examiner

Colored light pathway and the heat dissipation pathway

UPPER SUBSTRATE FOR MINIATURE LED COMPONENT, MINIATURE LED COMPONENT, AND MINIATURE LED DISPLAY DEVICE

TECHNICAL FIELD

This invention relates to an upper substrate for a miniature LED component, especially an upper substrate of a flexible miniature LED component (Micro-LED display), a miniature LED component (also called "open cell") and a miniature LED display device produced by using the upper substrate.

BACKGROUND TECHNIQUE

Micro-LED (miniature LED) technology, i.e., LED miniaturization and matrixing technology, refers to a high-density and small-size LED array integrated on a chip, if every pixel on the LED display can be located and separately driven to be lightened, it can be seen as a miniature version of an outdoor LED display, this technology reduces pixel distance from millimeter level to micron level. Micro-LED display is a miniature display achieved through making a LED display driver circuit on the bottom layer of the play by using normal CMOS (complementary metal oxide semiconductor) integrated circuit manufacturing process, and then making LED array on the integrated circuit by using MOCVD machine, it is also known as a reduced version of the LED display.

Since the 1990s, TFT-LCD (thin film transistor liquid crystal display) has begun to flourish. However, LED is characterized by its high color saturation, power saving, and thinness etc. Some manufacturers use LEDs as back-lights. However, due to its high cost, poor heat dissipation, and low photoelectric efficiency, LED has not been widely used in TFT-LCD products.

Until 2000, the method, efficiency, and cost of making white LEDs by using blue LED chip to stimulate the phosphor began to mature. Since 2008, white LED back-light modules have shown explosive growth and almost completely replaced CCFL (cold cathode fluorescent lamp) in a few years, and its application fields include mobile phones, tablet computers, notebook computers, desktop monitors and even TVs.

However, due to the non-self-luminous display principle of TFT-LCD, the transmittance of its liquid crystal panel (open cell) is about 7% or less, and this results in low photoelectric efficiency of TFT-LCD. In addition, the color saturation provided by white LEDs is still not as good as that of three primary colors LEDs, and most TFT-LCD products are only about 72% NTSC (National Television Standards Committee, United States). In addition, the brightness of TFT-LCD cannot be increased to more than 1000nits in outdoor environments, resulting in low image and color recognition, and this is a major defect in its application. Therefore, another LED display or Micro-LED display technology directly using three primary color LEDs as self-luminous display dot pixels is also being developed.

As mentioned above, miniature LED display (Micro-LED display) is a new generation of display technology, its structure is a miniaturized LED array, that is, the LED structure design is thinned, miniaturized and arrayed, making its volume about 1% of the size of the current mainstream LED, each pixel can be addressed and separately driven to emit light, reducing the pixel distance from the original millimeter level to the micron level.

Inheriting the characteristics of LED, the advantages of Micro-LED include low power consumption, high brightness, ultra high resolution and color saturation, fast response speed, ultra power saving, long service life, high efficiency, etc., and its power consumption is about 10% of that of LCD, and 50% of that of OLED. Compared with OLED, which is also a self-luminous display, Micro-LED has a brightness being 30 times higher than OLED, and a resolution of up to 1500 PPI (pixel density) which is equivalent to 5 times that of Apple Watch i.e., 300 PPI achieved by using an OLED panel. In addition, its good material stability and no image imprinting is also one of the advantages.

OLED improves the problems such as the LCD panel thickness, the needs to be adjusted with the back-light module, and the poor black level contrast, this can achieve a high contrast ratio. However, OLED must reduce the white screen and high brightness display in order to achieve power saving effect. The wide color gamut characteristic of OLED is not significantly different from that of KSF or quantum dots. On the other hand, Micro-LED is composed of a large number of miniature LED arrays, in addition to high brightness, ultra high resolution and color saturation, each pixel can be driven independently, and it also has the advantages of power saving and fast response, etc.

CONTENTS OF THE INVENTION

According to the anticipation of the LED Inside, from 2016 to 2021, the compound annual growth rate of the LED industry is 2%, and the overall industry growth has been limited. Judging from the development of display technology, Chu Yuchao pointed out that with the development of OLED technology for a long time, most of the related patents have been owned by Korean companies, and if we start now it may be difficult to catch up with Korean companies. In contrast, Micro-LED technology opens up another space for development.

The size of the Micro-LED is scaled down to the micron level, not only each pixel can be addressed, controlled, and separately driven to glow, it also has the advantages of high brightness, low power consumption, ultra high resolution and color saturation etc. In the future, it can even be bonded to a flexible substrate to achieve the flexible characteristics like OLED, and the application range is wider and more diverse. FIG. 1 shows a comparison diagram of the operating principles of the three major displays.

Based on the above description, it can be seen that there is an urgent need for research on miniature LED displays in this field. The structure of a miniature LED display is described in Patent Document 1 (WO2014/093065), which specifically describes a display panel and a method of forming the display panel. The display panel may include a thin film transistor substrate having a pixel area and a non-pixel area. The display area includes a bank opening array and a bottom electrode array in the bank opening array. A ground line is located in the non-pixel area, and an array of ground tie lines run between the bank openings in the pixel area and are electrically connected to the ground line in the non-pixel area. Patent Document 2 (WO2014/093063) also describes a miniature LED display structure, which specifically relates to a reflective bank structure of a light emitting device. The reflective bank structure may include a substrate, an insulating layer on the substrate, and an array of bank openings in the insulating layer, wherein each bank opening includes a bottom surface and sidewalls. A reflective layer spans the sidewalls of each of the bank openings in the insulating layer.

Generally speaking, whether the LED lamp works stably and the quality is good or bad, the heat dissipation of the lamp body itself is an very important factor. At present, methods for solving the heat dissipation problem of electronic parts in the industry can be divided into active heat dissipation and passive heat dissipation. Active heat dissipation includes fan forced heat dissipation and electromagnetic jet heat dissipation. The fan forced heat dissipation, as the name implies, is to generate strong air convection by the fan, so as to direct the hot air out of the heat source or the lamp body for heat dissipation. The fan forced heat dissipation can effectively dissipate heat by regulating the fan speed, if there is sufficient space in the computer or server and other electronic products, the fan is mostly used for forced heat dissipation, and this method is not only low cost but also a very effective heat dissipation method.

Passive heat dissipation includes natural convection heat dissipation and loop heat pipe heat dissipation, wherein natural convection heat dissipation is through directly contacting air with radiators, such as fins, lamp housings, system circuit boards, etc. The air around the radiator becomes hot air due to the absorption of heat, then the hot air rises and the cold air falls, and this naturally drives the air to produce convection, thereby achieving the effect of heat dissipation. For electronic products with limited institutional space, such as mobile phones or tablet computers, and even LED light sources, they are not suitable for installing fans, and this heat dissipation method is adopted mostly. However, the driving force for heat exchange in this method only comes from the temperature difference between the heat source and the surrounding air, and the heat dissipation effect can only be improved by increasing the contact area.

At present, the natural heat dissipation is usually used in high-brightness LED lamps in the market, and its heat dissipation effect is not ideal. LED lamps made of LED light source are composed of LED, heat dissipation structure, driver and lens, so the heat dissipation is an important portion. If the LED does not dissipate heat well, its service life will be affected as well.

In addition, heat has great influence on high-brightness LEDs. The heat is usually concentrated in a chip with a small size, and the increase of chip temperature causes a non-uniform distribution of thermal stress, and reduces the chip luminous efficiency and phosphor emission efficiency. When the temperature exceeds a certain value, the failure rate of a component increases exponentially. Statistic data shows that every 2° C. increase of the temperature of the part reduces reliability by 10%. Further, when multiple LEDs are densely arranged to form a white light illumination system, the problem of heat dissipation is more serious. Solving thermal management problems has become a prerequisite for high-brightness LED applications.

In addition, there is a certain relationship between the chip size and heat dissipation. The most direct way to increase the brightness of the LED is to increase the input power, and in order to prevent the saturation of the active layer, the size of the p-n junction must be increased accordingly. Increasing the input power will inevitably increase the junction temperature, which in turn will reduce the quantum efficiency. The increase in power of a single tube depends on the ability of the component to extract heat from the p-n junction, in the case of maintaining the existing chip material, structure, packaging process, current density on the chip unchanged and the equivalent heat dissipation conditions, if only the size of the chip is increased, the temperature of the junction region will keep rising.

This problem is more prominent for a miniature LED display device, since the miniature LED display device is composed of a large number of miniature LED arrays, so the heat dissipation problem must be considered when designing the structure of the miniature LED display device.

On the other hand, in the field of materials, there are a variety of thermally conductive materials, the thermally conductive materials according to the invention generally refer to substances that can transfer heat, which can be metals or synthetic materials, including silicone grease and thermally conductive glue (epoxy resins added with thermally conductive particles), thermally conductive double-sided adhesive, thermally conductive pads (divided into silicon and non-silicon materials), phase change materials, etc. These materials have their own advantages and disadvantages, and the application occasions are different. Thermal conductivity is one of the material's thermal physical parameters, and it is also the most important thermal physical parameter of solids. The thermal conductivity of materials with low thermal conductivity is an important parameter for characterizing the physical properties of materials for building energy saving and thermal insulation, the accurate measurement of the parameter value has very important theoretical and practical value.

Thermal gap filler comprises thermal conductive pad, thermal tape, and thermal grease, etc. The principle of filling the gap between the chip or the heating element and the heat sink is used as a path for providing heat conduction and filling a gap of 0.125 mm-10 mm. It can help transfer the heat energy of the chip, so that it is effectively conducted to the heat dissipation fins, thereby reducing the chip temperature and improving the service life and efficiency of the chips.

Generally a heat dissipation module includes thermal conductive glue, heat dissipation fins and fans. The heat conduction manner is to improve the efficiency of transferring heat to the heat dissipation fins by the surface of the chip, through the conductive materials including heat conductive glue (thermal gap filler), thermal tape, or thermal grease; as for the heat dissipation fins, the better the heat transfer coefficient is and the larger the area is, the stronger the heat dissipation effect is. If the chip produces high heat or the machine space is small, and the ventilation is not good, then a cooling fan is often added to the heat dissipation module to bring the heat energy out of the heat dissipation module more quickly. Such applications are mostly used in the products including notebook (laptop) computers, telecom devices, LCD TVs, LED lighting equipments, power supply units, DDR memory modules.

Thermally conductive adhesive is a type of heat transferring medium, usually includes the following types: thermally conductive glue (heat dissipation glue), which is liquid or solid and can be made of epoxy resin, ceramic powder, or acrylic glue; thermal tape (heat dissipation tape), which is in the form of single-sided or double-sided tape, and is based on acrylic, silicone, or fiberglass reinforcement materials etc; thermally conductive silicone (heat dissipation silicone), most of which are solid, there is also liquid form, and it is composed of silicone material; thermally conductive silicone sheet (heat dissipation silicone sheet), which is in solid form and is composed of silicone material.

Among them, epoxy resin is a kind of thermal conductive glue substance, it is reported that an epoxy resin has been developed to have a maximum thermal conductivity and insulation of 7.3 W/mK. It can be used for heat dissipation applications in engines, LED lighting, power supply components, and semiconductor packages.

In addition to the above heat conductive materials, in recent years, graphene has received widespread attention as a new type of material. Graphene is a carbonaceous material with a two-dimensional honeycomb crystal structure formed by SP² hybridizing and stacking a single layer of carbon atoms, it has unique electrical properties, such as quantum Hall effect, field effect, Fermi effect, relatively high light transmittance and high electron mobility. Various studies have been conducted on various uses of graphene.

In addition to the above effects, graphene also has a very excellent thermal conductivity. Researchers have found that the thermal radiation emissivity of graphene in the infrared range is 0.99, which is very close to the theoretical thermal radiation emissivity of blackbody radiation 1. Therefore, graphene has considerable potential as a heat dissipation material for thermal radiation. Relative to the thermal radiation coefficient of about 0.09 for copper and about 0.02 for aluminum, graphene has the characteristics of both heat conduction and thermal radiation in heat dissipation applications.

In addition, generally thermal conductivity may be used to measure the thermal conductivity property of a material. Thermal conductivity k, also known as heat conductivity, refers to the ability of a material to directly conduct heat. Thermal conductivity is defined as the heat directly conducted by a unit of cross-section and length of the material at a unit temperature difference and in a unit time. The unit of thermal conductivity is $Win^{-1} K^{-1}$. The thermal conductivity values of some substances are shown in Table 1 below. It can be seen from Table 1 that graphene has excellent thermal conductivity.

Thermal conductivity, $$k = \frac{\Delta Q}{A \Delta f} \frac{x}{\Delta T};$$

wherein

A is the cross-sectional area of a heat conductor, $$\frac{\Delta Q}{\Delta t}$$

is the amount of heat transferred per unit time, x is the thickness of a heat conductor between two heat sources, and ΔT is the temperature difference.

TABLE 1

| Substance | Substance state | Thermal Conductivity $Wm^{-1}K^{-1}$ |
|---|---|---|
| Graphene | Solid | (4840 ± 440)~(5300 ± 480) |
| Diamond | Solid state | 900~2320\ |
| Silver | Solid | 420 |
| Copper | Solid | 401 |
| Gold | Solid | 318 |
| Aluminum | Solid | 237 |
| Platinum | Solid | 70 |
| Iron | Solid | 80 |

According to Khan et al. (Khan, U., O'Neill, A., Lotya, M., De, S. and Coleman, J N (2010) High-Concentration Solvent Exfoliation of Graphene. Small, 6, 864-871), 10vol. % multi-layer graphene is added as a thermal conductivity adjuvant in epoxy resin to be used as a thermal conduction material, this study shows that the addition of graphene can increase the thermal conductivity by 2300%. Adding 2% of graphene to commercially available thermal interface materials (using aluminum powder or zinc oxide powder as a thermal conductivity additive), the thermal conductivity k value can be increased from 5.8 W/m·K to 14 W/m·K. It can be seen that graphene has excellent thermal conductivity.

Patent Document 3 (CN105899053A) discloses a graphene heat dissipation film made of graphite, graphene, and metal ions. In this patent document, the combination of graphene and metal ions is used to form a vertical and horizontal graphene distribution pattern to achieve an overall heat dissipation and heat conduction, thereby having a good heat dissipation effect. This patent document focuses on the interaction between graphite, graphene, and metal ions, it is believed that the structure of the graphene heat dissipation film formed by the three substances is stable and can be widely used in various places.

In the existing TFT-LCD composition, the color portion is derived from the color filter (as shown in FIG. 3), which accounts for about 20% of the cost of the TFT-LCD. Among them, in recent years, in-depth research and development of the color filter material has achieved good results. In this TFT-LCD panel structure diagram, the black matrix portion has the most urgent improvement requirement with the highest technical level. The black matrix has the following three main functions: (1) preventing the color mixture of color photoresists (the color photoresists of red, green, blue and other color photoresist): when the back-light source of the TFT-LCD passes through the three-color coloured layer, usually light scattering and refraction will occur, thereby resulting in color mixture and reducing the vividness and purity of colors, and the main purpose of the black matrix is to effectively separate the three-color layer; (2) improving the contrast value of red, green and blue; (3) having optical rotation shielding for driving electrodes such as thin-film transistor (TFT): light will cause partial damage to TFT, so it is necessary to use black matrix to effectively shield TFT.

As for the black matrix sources currently used for color filters in TFT-LCD panels, there are roughly the following types: (1) metallic chromium (Cr) black matrix; (2) resin-type black matrix; and (3) electroless nickel plating (Ni) black matrix.

For a miniature LED component, a black matrix layer with openings is formed on the exposed front surface of, for example, a flexible display substrate. Exemplary black matrix materials that can be used in LEDs include carbon, metal films (e.g., nickel, aluminum, molybdenum, and alloys), metal oxide films (e.g., chromium oxide), metal nitride films (e.g., chromium nitride), organic resin, glass paste and resin or paste containing black pigments or silver particles. The black matrix layer prevents LEDs from penetrating between LEDs or being absorbed by adjacent LEDs. Therefore, the presence of the black matrix layer improves the contrast of the image displayed on the flexible display panel. The black matrix layer can be formed by using, for example, ink jet printing, sputtering and etching, spin coating, lamination, or printing methods.

During the research of the scheme described herein, the inventor of this invention suddenly realized that if graphene material is used to make the black matrix of the miniature LED component, it can play the role of the black matrix, and at the same time, the heat generated by the wafer and the like of the lower substrate of the miniature LED component may be efficiently extracted, that is, in the invention described herein, the high-thickness and high shading coefficient film formed of graphene simultaneously performs both functions of the black matrix and heat dissipation. In addition, since graphene can be patterned by using ink jet, screen printing and other process technologies, a black matrix can be easily formed.

An object of this invention is to provide a graphene heat dissipation film, which can be used in the upper substrate of the miniature LED component, and it has the function of dissipating the heat of the LED and the black matrix structure which is necessary for the miniature LED display to improve the optical contrast. That is, a film has the dual functions of heat dissipation and the separation of a color structure.

Another object of this invention is to provide an upper substrate for a miniature LED component, especially as an upper substrate for a flexible miniature LED component; in addition to covering the R (red)/G (green)/B (blue) LED pixels from leaking light to improve the contrast of the display, it also has the effect of conducting the heat source of heat accumulation or heat generation of the LED to the outside environment. Among them, the black matrix in the upper substrate is formed of graphene. With different coating thicknesses, the black matrix has a very low light transmittance under visible light, and has the heat dissipation function in the X, Y, and Z directions.

Another object of this invention is to provide an integrated upper substrate for a miniature LED component, especially an integrated upper substrate for a flexible miniature LED component, which is in the form of an integrated diaphragm. After the integrated upper substrate is produced, it will be delivered to downstream customers who produce miniature LED components, and the customers can directly attach the integrated upper substrate to the lower substrate for a miniature LED component, and obtain a semi-finished product after alignment, i.e., a miniature LED component, also called as "open cell".

Another object of this invention is to provide a miniature LED component comprising the upper substrate for a miniature LED component described herein, and a display device comprising the miniature LED component.

Another object of this invention is to provide a method for preparing the upper substrate for a miniature LED component according to the invention.

The objects of this invention are achieved through the following technical solutions.

1. An upper substrate for a miniature LED component, comprising:
   a bottom substrate;
   a metal layer formed on the bottom substrate and having a pattern capable of covering a non-opening region of the lower substrate for the miniature LED component;
   a graphene layer formed on the bottom substrate; and
   a transparent adhesive layer formed on the bottom substrate to cover the metal layer and the graphene layer.

2. The upper substrate for a miniature LED component according to item 1, wherein,
   the graphene layer has an opening capable of exposing the light-transmitting region of the lower substrate for the miniature LED component, so as to serve as a black matrix of the miniature LED component.

3. The upper substrate for a miniature LED component according to item 1 or 2, further comprising:
   an interlayer formed on the graphene layer, the interlayer is in contact with the region other than the LED component and the wires of the lower substrate when being bonded to the lower substrate for the miniature LED component.

4. The upper substrate for a miniature LED component according to any one of items 1-3, wherein the thickness of the metal layer at the position corresponding to the wafer of the lower substrate for the miniature LED component on the bottom substrate is thickened, or the width is widened.

5. The upper substrate for a miniature LED component according to any one of items 1-4, wherein
   the thickness of the graphene layer is 5 μm or more, preferably 50 μm or less, more preferably 40 μm or less, and more preferably 30 μm or less.

6. A miniature LED component, comprising:
   the upper substrate described in any one of items 1-5, and
   the lower substrate for the miniature LED component.

7. A display device, comprising:
   the miniature LED component described in item 6.

8. The display device according to item 7, further comprising a metal sheet for heat dissipation.

9. A method for preparing an upper substrate for a miniature LED component, which includes the following steps:
   forming a metal layer on the bottom substrate, wherein the metal layer has a pattern capable of covering a non-opening region of the lower substrate for the miniature LED component;
   forming a graphene layer on the bottom substrate on which the metal layer is formed; and
   forming a transparent adhesive layer on the bottom substrate on which the metal layer and the graphene layer are formed.

10. The method for preparing an upper substrate for a miniature LED component according to item 9, further including:
    thickening or widening the metal of the metal layer on the bottom substrate, wherein the metal of the metal layer is located at the position corresponding to the wafer of the lower substrate for the miniature LED component.

11. The method for preparing an upper substrate for a miniature LED component according to item 9 or 10, further including:
    forming an interlayer on the graphene layer so that the interlayer is in contact with the region other than the LED component and wires of the lower substrate for the miniature LED component when being bonded to the lower substrate for the miniature LED component.

EFFECT OF THE PRESENT INVENTION

The graphene film in the upper substrate for a miniature LED component provided herein has the dual functions of heat dissipation and the separation of a color structure. The film has both the function of dissipating the heat of the LED and the black matrix structure which is necessary for the miniature LED display to improve the optical contrast.

This invention first proposes the "integrated upper substrate" used exclusively for a miniature LED display, especially a flexible miniature LED; and the upper substrate is in the form of an integrated diaphragm. After the integrated upper substrate is produced, it will be delivered to downstream customers who produce the miniature LED components, and the customers can directly attach it to the lower substrate of a miniature LED array, and obtain a semi-finished display (also as called as "open cell") after alignment.

The upper substrate for a miniature LED component according to the invention, a metal layer with a high film thickness and heat storage at a specific position can be designed on the upper substrate for the component processor that drives hundreds of millions of miniature LED wafers, so as to further effectively dissipate the thermal energy.

The upper substrate for a miniature LED component according to the invention, since an interlayer is added to the upper substrate, during the winding process of especially the flexible miniature LED component, it is possible to prevent the impact of the upper substrate on the array of the lower substrate of the miniature LED component, thus the interlayer disperses the downward pressure of the entire display.

According to the invention, since the metal pattern of the upper substrate provided herein has the cross alignment marks before bonding to the lower substrate, it does not need to be remade, and the alignment accuracy can be improved.

BRIEF DESCRIPTION OF THE DRAWINGS

Various other advantages and benefits of the present invention will become clear to those of ordinary skill in the art by reading the detailed description in the preferred embodiments below. The drawings in the specification are only for the purpose of illustrating the preferred embodiments, and should not be considered as a limitation to the present invention. Obviously, the drawings described below are only some embodiments of the present invention, for a person of ordinary skill in the art, without paying any creative work, other drawings can also be obtained based on these drawings. Furthermore, throughout the drawings, the same reference numerals denote the same components.

DETAILED DESCRIPTION OF EMBODIMENTS

Figure 1:
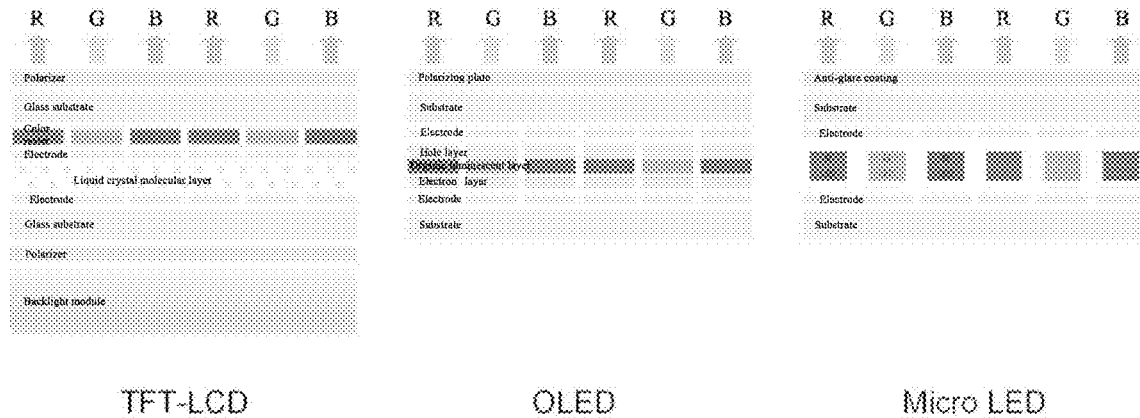
FIG. 1 shows a comparison of the three major displays.

The specific embodiments herein will be described in more detail with reference to the accompanying drawings. Although the specific embodiments of this invention are shown in the drawings, it should be understood that this invention can be implemented in various forms and should not be limited by the embodiments set forth herein. Rather, these embodiments are provided to enable a more thorough understanding of this invention and to fully convey the scope of this invention to those skilled in the art.

This invention relates to a miniature LED component, and a miniature LED display device. The term "miniature" component or "micro" LED structure as used herein may refer to the descriptive dimensions of certain components or structures according to embodiments herein. As used herein, the term "miniature" component or structure refers to a size of 1 μm to 100 μm. Of course, those skilled in the art can understand that the above dimensions are only exemplary, and the size of the miniature LED component or display device according to the invention is not necessarily limited by this, and a larger or smaller scale may be applicable in some specific embodiments.

As used herein, the terms "across", "over", "between", and "above" may refer to the relative position of one layer relative to other layers. A layer which is located "across" another layer, or "over" another layer, or "above" another layer, or is "bonded (connected)" to another layer, may be directly contacted with other layers or there may be one or more intermediate layers. A layer "between" a plurality of layers may be directly contacted with the multiple layers or may have one or more intermediate layers. In this invention, "covering" means that one layer completely covers another layer; that is, A covering B means that A completely covers B, and B can make contact with the outside environment only by crossing A.

<Upper Substrate for a Miniature LED Component According to the Invention>

The upper substrate for a miniature LED component according to the present invention, which comprises: a bottom substrate; a metal layer formed on the bottom substrate and having a pattern capable of covering a non-opening region of the lower substrate for the miniature LED component; a graphene layer formed on the bottom substrate; and a transparent adhesive layer formed on the bottom substrate to cover the metal layer and the graphene layer.

The bottom substrate may be a flexible plastic substrate or a glass substrate, and there is no restriction on the material of the substrate, as long as it can be used as a substrate material in an LED display, for example, a plastic substrate made of a material such as PET, PI, PS or PP. In the example shown in FIG. 2, the film thickness of the bottom substrate is below 150 μm, but it is only an exemplary description. The thickness of the bottom substrate is not limited, and those skilled in the art can design it according to the actual conditions.

Figure 2:
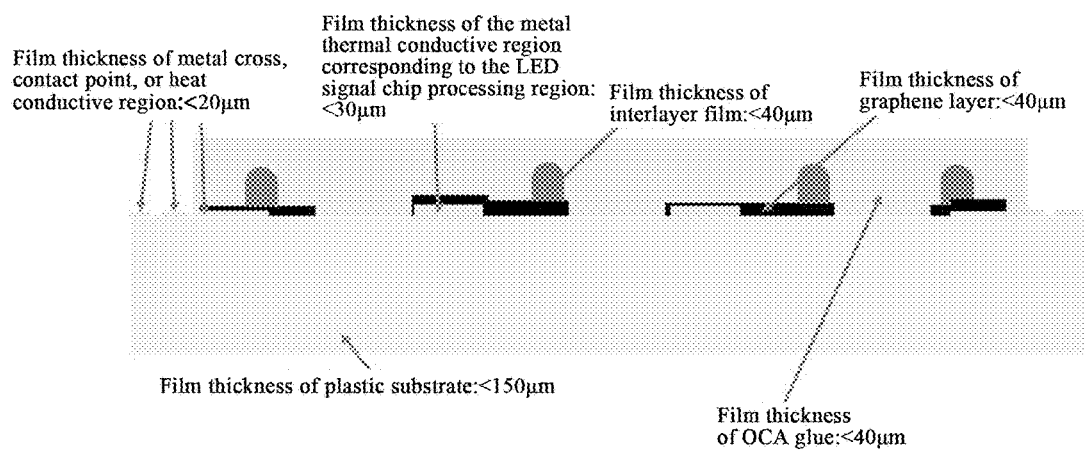
FIG. 2 shows a schematic diagram of an embodiment of an upper substrate for a miniature LED component according to the invention.
Figure 3:
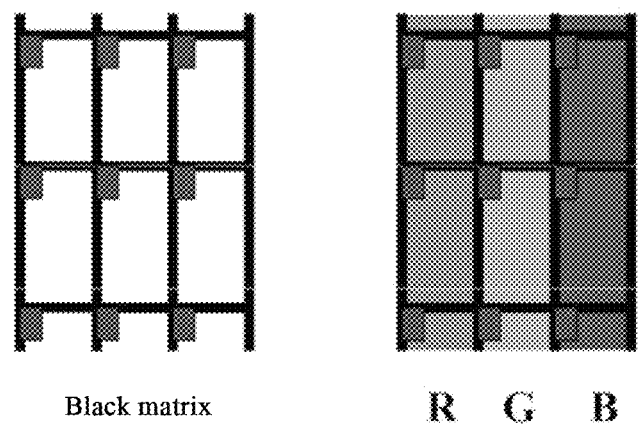
FIG. 3 is a schematic diagram showing the structure of a color filter and a black matrix.
Figure 4:
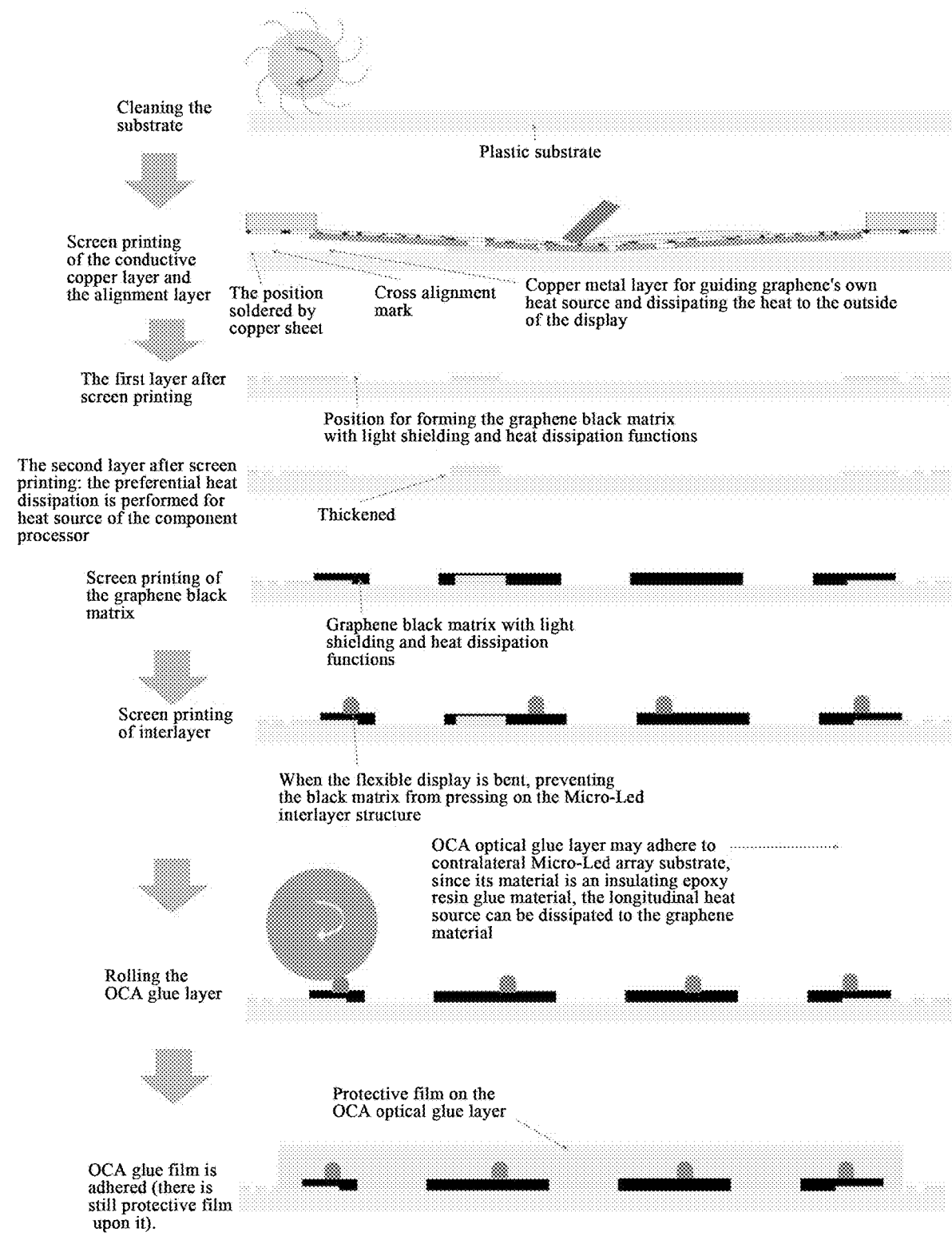
FIG. 4 shows a schematic flow chart of the preparation of the upper substrate according to the invention.

A metal layer having a pattern capable of covering the non-opening region of the lower substrate for the miniature LED component is formed on said bottom substrate. The metal layer is directly formed on the bottom substrate, and the metal layer mainly comprises the following portions: a position for soldering, a cross alignment mark for future alignment with the lower substrate for the miniature LED component, and a metal layer for guiding the below mentioned graphene's own heat source, which can dissipate the heat to the outside of the component. The pattern of the metal layer is designed according to the non-opening region of the lower substrate for the miniature LED component to be aligned and bonded, and the metal layer should be able to cover the non-opening region of the lower substrate for the LED component. FIGS. 2 and 4 give the schematic description of the metal layer. The metal material for forming the metal layer is not limited, and may be any metal that can be used in the LED display, for example, it can be an inorganic high thermal conductivity metal such as copper, aluminum, silver, iron, etc., preferably copper. In a specific embodiment according to the invention, it is preferable that the thickness of the metal layer at the position corresponding to the wafer of the lower substrate for the miniature LED component on the bottom substrate is thickened or widened. By this thickening or widening process, the heat generated at the lower substrate wafer can be more efficiently dissipated to the outside.

Figure 8:
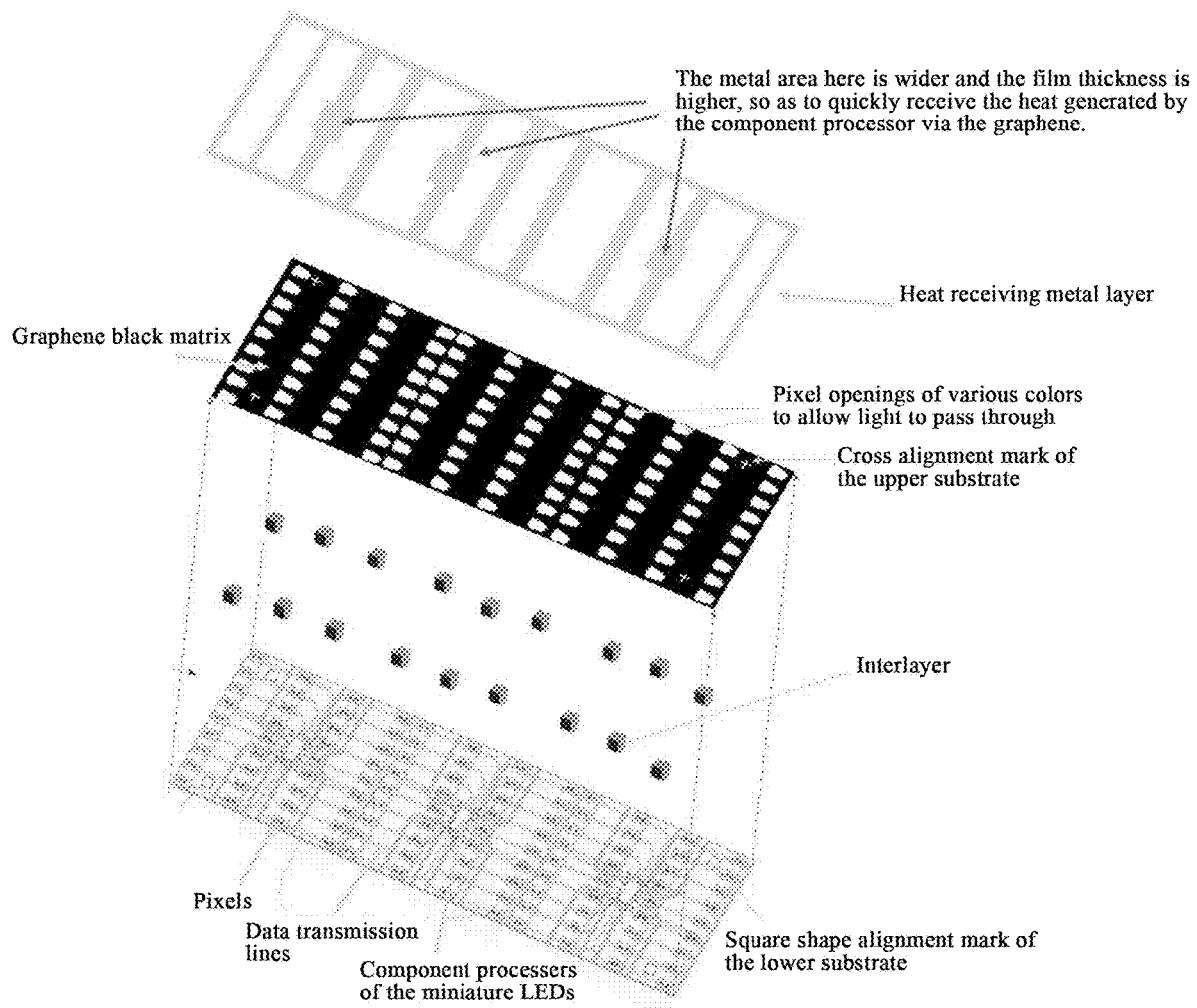
FIG. 8 schematically shows an exploded perspective view of the main structures in the upper and lower substrates according to the invention.

In addition, FIG. 8 schematically shows the structure of the metal layer, it can be seen that the metal layer has a given pattern, which is designed according to the lower substrate for the miniature LED to be bonded, so that the metal layer can cover the non-opening region of the lower substrate for the miniature LED component. In addition, it can be seen that in this schematic illustration, the area of a portion of the metal region in the metal layer is widened or its film thickness is thickened, and these widened and thickened portions correspond exactly to the lower substrate for the miniature LED component, this structure can quickly receive the heat brought by the graphene layer of the entire miniature LED component processor.

In a specific example according to the invention, the thickness of the metal layer is below 30 μm. However, those skilled in the art can understand that the thickness is adjustable, and there is no restriction to the upper limit, which can be adjusted according to the size of the entire upper substrate, the entire LED component, or the display device.

In the upper substrate described herein, a graphene layer is also formed on the bottom substrate, as shown in FIGS. 2 and 4, the graphene layer is formed on the bottom substrate and has openings that can expose the transparent region of the lower substrate for the miniature LED component. This graphene layer will be used as a black matrix for the miniature LED component. In addition, as shown in FIG. 2 and FIG. 4, some graphene portion in the graphene layer with openings is partially formed on the bottom substrate across the metal layer; that is, the graphene is partially formed on the metal layer, and a portion of the graphene is in contact with the bottom substrate; some graphene is formed on the bottom substrate by covering the metal layer; and some graphene is formed on the bottom substrate without contacting with the metal layer. The position of the opening in the graphene layer is also designed according to the lower substrate for the miniature LED component, so as to ensure that it can expose the light-transmitting region of the lower substrate for the miniature LED component, so that it can function as the black matrix of the miniature LED component.

In addition, FIG. 8 schematically shows a schematic diagram of the graphene layer. It can be seen that the graphene layer has openings that can expose the light-transmitting region of the lower substrate for the miniature LED component, i.e., the openings for pixels of various colors, so that the light may pass through. In addition, the cross alignment mark on the upper substrate can also be exposed on the graphene layer; that is, the portion corresponding to the cross alignment mark on the graphene layer is hollowed out, so that the cross alignment mark on the upper substrate can be exposed to further improve the alignment precision of the substrate bonding. Among them, the cross alignment mark is formed on the upper substrate PET, and the square shape alignment mark is formed on the plastic substrate layer of the lower substrate.

The upper substrate for the miniature LED component according to the invention, the thickness of the graphene layer is not limited, but in order to fully function as a black matrix, the thickness of the graphene layer is required to be 1 μm or more.

In this invention, the graphene layer acts as a black matrix, so it needs to be able to block light, and the stronger the shading ability is, the higher the OD value of the graphene layer is required. According to the formula of Beer-Lambert law, as long as the intensity of transmitted light and incident light can be measured, the absorbance value (A) can be calculated. $A=-\log_{10}$ (transmitted light intensity/incident light intensity). For example, taking the calculation of the transmittance from the OD value as an example, when OD=0.05, the transmittance is $10^{\wedge}(-0.05)$ $=0.891$, and the light transmission rate is 89.1%; when OD=0.5, the transmittance is $10^{\wedge}(-0.5)=0.3162$, the light transmission rate is 31.62%; when OD=1, the transmittance is $10^{\wedge}(-1)=0.1$, the light transmission rate is 10%; when OD=2, the transmittance is $10^{\wedge}(-2)=0.01$, the light transmission rate is 1%. It can be seen from the above calculation manner that, in this invention, the thickness of the graphene layer is preferably 5 μm or more, with such a thickness, the graphene layer can fully function as a black matrix, in addition, the upper limit of the thickness of the graphene layer is not limited, those skilled in the art can choose and design it according to the actual needs and sizes of the miniature LED component and display. In a specific embodiment, the thickness of the graphene layer is preferably 50 μm or less, preferably 40 μm or less, and more preferably 30 μm or less.

Figure 10:
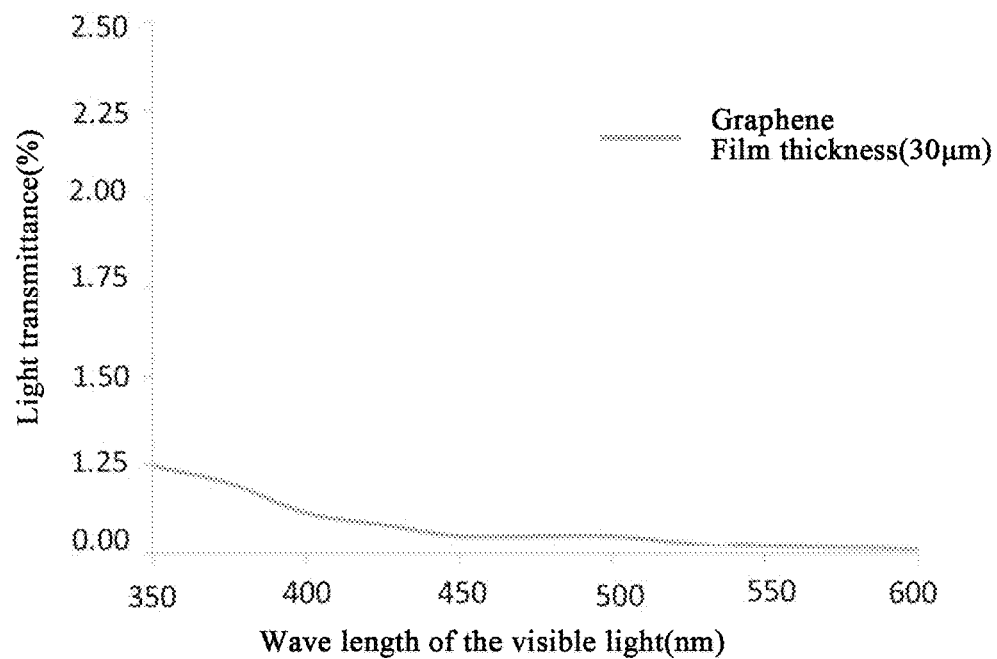
FIG. 10 shows the light transmittance of a graphene layer with a certain thickness at different wavelengths of visible light.

In a specific embodiment, when the film thickness of the graphene layer is 30 μm, the data of the light transmittance for each visible light wavelength is summarized in FIG. 10, it can be seen that the graphene layer having said film thickness has a very low light transmittance at each wavelength, so it can fully function as a black matrix.

In a specific embodiment, the upper substrate for the miniature LED component according to the invention further comprises: an interlayer formed on the graphene layer, the interlayer is in contact with the region other than the LED component and the wires of the lower substrate when being bonded to the lower substrate for the miniature LED component. In this context, "contact" refers to physical contact, that is, the interlayer actually contacts the region other than the LED component and the wires of the lower substrate. Further, especially for a flexible display, there is such an interlayer that it prevents the black matrix from pressing against the wires and the processor on the lower substrate for the miniature LED component when the flexible display is bent. The schematic structure of the interlayer is given in FIG. 2. In addition, FIG. 8 shows the three-dimensional structure of the interlayer and its mode of operation, by forming the interlayer, during the winding process of the flexible miniature LED display, it is effective to prevent the upper substrate from applying an impact on the array of the lower substrate of the miniature LED component, thus the interlayer can disperse the downward pressure of the entire display.

In this context, the interlayer can be formed by using materials commonly used to form photoresist resins. For example, negative photoresist, also known as photoresist, is a light-sensitive mixed liquid composed of three main components: photosensitive resin, sensitizer (see spectral sensitizing dye) and solvent. After the photosensitive resin is exposed to light, the photocuring reaction can occur quickly in the exposed region, and significantly changes the physical properties of this material, especially the solubility and affinity. After proper solvent treatment, the soluble portion is dissolved to obtain the desired image. In addition, photoresists are widely used in manufacturing the printed circuits and integrated circuits, as well as in printing and platemaking processes. The technology of photoresist is complex and various. According to its chemical reaction mechanism and development principle, it can be divided into two types: negative glue and positive glue. It is negative glue that forms insoluble matter after light irradiation; on the contrary, when it is insoluble to some solvents, the positive glue becomes soluble after light irradiation. By utilizing this performance, the photoresist may be used as a coating, and the desired circuit pattern is etched on the surface of the silicon wafer. Based on the chemical structure of the photosensitive resin, photoresists can be divided into three types. ①Photopolymerization type, which uses ethylenic monomers to generate free radicals under the action of light, and then the free radicals further initiate the polymerization of monomers, finally generating polymers; and it has the characteristics of forming positive images. ②Photodecomposition type, which uses the materials containing azidoquinone compounds to conduct photodecomposition reaction after light irradiation, then it changes from oil-soluble to water-soluble and may be made into positive glue. ③Photocrosslinking type, which uses polyvinyl alcohol laurate as the photosensitive material, the double bond in its molecule is opened under the action of light, and the crosslinking between chains occurs, thereby forming an insoluble network to function as a resist; and it is a typical negative photoresist. Herein, the photoresist resin used to form the interlayer may be a positive photoresist resin or a negative photoresist resin.

In this invention, there is no limitation on the thickness of the interlayer, the thickness can be designed according to the specific size of the upper substrate and the lower substrate of the entire miniature LED component; in a specific embodiment according to the invention, the thickness of the interlayer is less than 40 μm.

In this invention, the upper substrate for the miniature LED component further comprises a transparent adhesive layer formed on the bottom substrate to cover the metal layer and the graphene layer. The transparent adhesive layer may be formed by OCA optical glue (optical clear adhesive).

The OCA optical glue used herein is a special adhesive for bonding transparent optical components (such as lenses, etc.). OCA optical glue is required to be colorless and transparent, with a light transmittance of being above 90%, and good bonding strength; it can be cured at room temperature or moderate temperature, and has the characteristics of small curing shrinkage. It can be considered that OCA is a double-sided tape with optical transparency. OCA optical glue is one of the important raw materials for touch screen. The optical acrylic glue is made into a no substrate structure, and then a layer of mold release film is respectively bonded on the upper and the lower bottom layers to make a double-sided adhesive tape without base material. OCA optical glue is suitable as an adhesive for touch screens. The advantages of OCA optical glue are clearness, high light transmittance (full light transmittance>99%), high adhesion, high weather resistance, water resistance, high temperature resistance, UV resistance, adjustable thickness, providing uniform spacing, without producing problems including yellowing (yellow stain), peeling and deterioration after long-term use.

OCA optical glue can be divided into two categories, one is resistive and the other is capacitive; resistive optical glues can be divided into 50 μm and 25 μm optical glues according to the thickness, and the capacitive optical glues are divided into 100 μm, 174 μm, 200 μm optical glues.

The optical glues can be applied to different fields according to different thicknesses, its main uses are: electronic paper, the bonding of transparent component, the assembling of projection screen, the assembling of aerospace or military optical component, the assembling of display, the assembling of lens, and the bonding of resistive touch screen G+F+F, F+F, capacitive touch screen, panel, ICON, glass and polycarbonate and other plastic materials, special adhesive for bonding transparent optical components (such as lenses, etc.). Silicone rubber, acrylic resin, unsaturated polyester, polyurethane, epoxy resin and other adhesives can bond the optical components. In the formulation, some treatment agents are usually added to improve its optical properties or reduce the curing shrinkage. It is suitable for fixing various films and screens (acrylic screen, glass screen, and touch screen, etc.) at the periphery of the display of a mobile device. The use of OCA optical glue can reduce glare, reduce the loss of light emitted by the LCD, increase the brightness of the LCD and improve the light transmittance, reduce energy consumption; and can increase the contrast, especially the contrast under strong light irradiation; thereby giving the surface connection higher strength; avoiding the generation of Newton's ring; making the product surface smoother; making the product without borders, and expanding the visible region, etc.

As shown in FIG. 2, the transparent adhesive layer is formed on the bottom substrate, which completely covers the metal layer, the graphene layer, and the optional interlayer. In addition, the transparent adhesive layer usually has a protective film on it, and the protective film can be peeled off before being used for bonding with the lower substrate. In a specific example according to the invention, the film thickness of the OCA glue layer is below 40 μm, but the thickness is only illustrative and there is no restriction to the thickness of the layer.

FIG. 2 shows a schematic diagram of the structure of the upper substrate of the miniature LED component according to the invention. FIG. 4 shows the preparation method of the upper substrate, and the preparation method of the upper substrate will be described in further detail below.

<Miniature LED Component According to the Invention>

This invention further comprises a miniature LED component (also commonly referred to as an "open cell"), which comprises: an upper substrate for the miniature LED component, and a lower substrate for the miniature LED component according to the invention. The upper substrate for the miniature LED component and the lower substrate for the miniature LED component according to the invention are bonded together by the transparent adhesive layer of the upper substrate.

Figure 5:
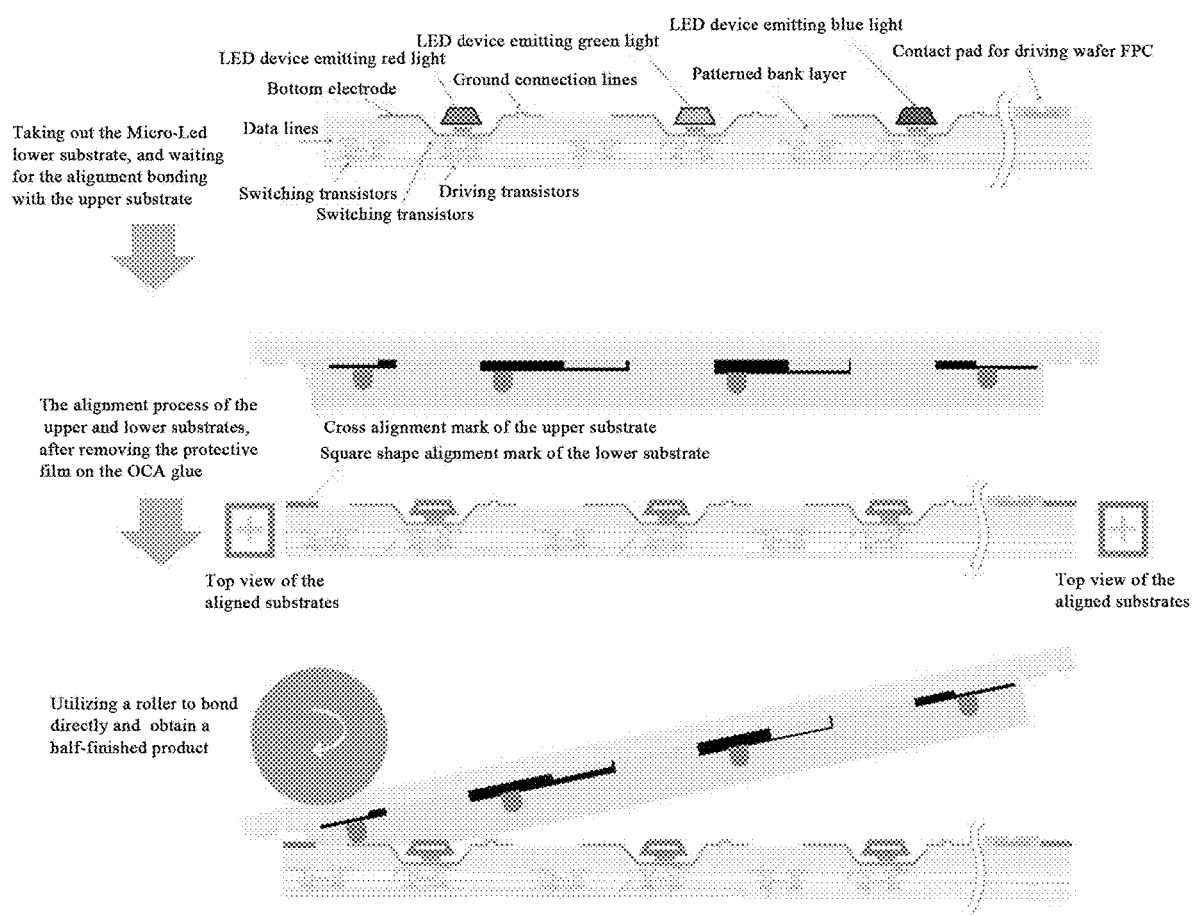
FIG. 5 shows a schematic flow chart of the bonding of the upper substrate and the lower substrate for a miniature LED according to the invention.

Generally, the lower substrate for a miniature LED component may comprise switching transistors, driving transistors, data lines, bottom electrodes, ground connection lines, patterned bank layers, contact pads for driving wafer FPC, and miniature LED devices emitting red light, the miniature LED device emitting green light, and the miniature LED device emitting blue light, as shown in FIG. 5.

FIG. 5 shows an example of a method for preparing the miniature LED component according to the invention, and this preparation method will be described in detail below.

<Miniature LED Display Device According to the Invention>

The miniature LED display device according to the invention comprises: the miniature LED component according to the invention.

In a preferred embodiment, the miniature LED display device according to the invention further comprises a metal sheet for heat dissipation. For the metal sheet for heat dissipation, any material capable of dissipating heat can be used, for example, copper, aluminum, silver, iron and other inorganic high thermal conductivity metals, and copper is preferably used.

For large-scale displays such as TVs, it is often necessary to add a metal sheet for heat dissipation to further assist the heat dissipation, and for small and medium-sized displays such as mobile phones and tablet computers, the metal sheet for heat dissipation can be omitted.

Figure 7:
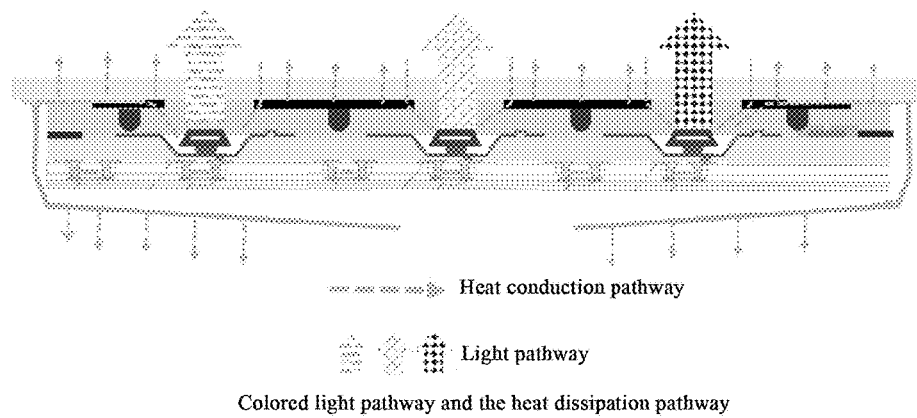
FIG. 7 schematically shows the heat conduction path and the light conduction path of the miniature LED component according to the invention.

FIG. 7 shows a schematic diagram of a miniature LED display device according to the invention.

<Preparation of the Upper Substrate According to the Invention>

This invention also relates to a method for preparing an upper substrate for a miniature LED component, which includes the following steps: forming a metal layer on a bottom substrate, wherein the metal layer has a pattern capable of covering a non-opening region of the lower substrate for the miniature LED component; forming a graphene layer on the bottom substrate on which said metal layer is formed; and forming a transparent adhesive layer on the bottom substrate on which the metal layer and the graphene layer are formed.

In a preferred embodiment, the method for preparing an upper substrate for a miniature LED component according to the invention further includes: thickening or widening the metal of the metal layer on the bottom substrate on the bottom substrate, wherein the metal of the metal layer is located at the position corresponding to the wafer of the lower substrate for the miniature LED component. At the corresponding position refers to at a position corresponding to the wafer of the lower substrate for the miniature LED component, and the metal layer at the corresponding position does not actually contact with the wafer of the lower substrate.

In a preferred embodiment, the method for preparing an upper substrate for a miniature LED component according to the invention further includes: forming an interlayer on the graphene layer, so that the interlayer is in contact with the region other than the LED component and the wires of the lower substrate for the miniature LED component when being bonded to the lower substrate for the miniature LED component.

FIG. 4 shows an example diagram of a method for preparing the upper substrate according to the invention. In the first step, firstly preparing a bottom substrate, preferably the bottom substrate is a flexible plastic substrate or a glass substrate; there is no restriction on the material of the substrate, as long as it can be used in LED display substrates, for example, plastic substrate made of PET, or PI. In this step, the bottom substrate needs to be further cleaned for the subsequent printing step. In this step, the thickness of the bottom substrate to be used is 150 µm or less, as shown in FIG. 2. However, this thickness is only exemplary, in the upper substrate according to the invention, there is no specific restriction to this thickness, and it can be appropriately designed according to the structure of the miniature LED component to be prepared.

In the second step, a wire screen printing step is performed on the cleaned bottom substrate to form a thermally conductive metal layer and an alignment layer at predetermined positions on the bottom substrate. For example, a metal layer is formed on the bottom substrate, wherein the metal layer is used for a position for welding with a metal sheet, a cross-alignment mark, and the dissipation of the heat source of the graphene layer formed subsequently, said metal layer may dissipate the heat generated by the use of a display to the display periphery. In this method, copper is used to form a position for welding with a metal sheet and a cross alignment mark. In a specific embodiment of the upper substrate according to the invention, the film thickness of the formed metal welding position, metal cross alignment mark, and heat conduction region is less than 20 µm, as shown in FIG. 2. However, this thickness is only exemplary, in the upper substrate according to the invention, there is no specific restriction to this thickness, and it can be appropriately designed according to the structure of the miniature LED component to be prepared.

The metal material used in the second step is not specifically limited, and may be any metal that can be used in the LED display, such as copper, aluminum, etc., preferably copper. The first layer on the bottom substrate is formed by screen, and a portion is reserved at a position set as required for forming a graphene black matrix with light shielding and heat dissipation functions. In the second step, according to the requirements of the specific miniature LED component, a second screen printing can also be performed, and in the second screen printing, some wires formed on the bottom substrate are thickened, so that the preferential heat dissipation is performed for the heat source of the component processor of the miniature LED component. In a specific embodiment of the upper substrate according to the invention, the thickness of the thickened metal layer may be less than 30 µm, as shown in FIG. 2. The thickening operation is performed because when there are tiny wafers on the lower substrate used by some manufacturers for the production of the miniature LED component so as to achieve multi-LED control, it is necessary to thicken the metal wires at some key positions of the upper substrate so as to achieve sufficient heat dissipation. When designing the upper substrate of the invention, the design can be performed according to the needs of the downstream manufacturers of the miniature LED components, so that the metal wires at some specific positions can be thickened in the second step. Similarly, there is no specific restriction to the thickness of the thickened wires, and the thickness of the metal layer can be designed according to the circumstances when the heat dissipation is preferentially needed.

Next, in the third step, a black matrix of graphene with light shielding and heat dissipation functions is formed at corresponding positions by screen printing. In the upper substrate according to the invention, the graphene layer has two functions simultaneously, that is, the graphene layer serves as a black matrix for separating red, green, and blue color regions, and the graphene layer is also used as a heat dissipation layer due to the excellent thermal conductivity of graphene. In a specific embodiment, the thickness of the graphene layer formed by screen printing is 40 µm or less, as shown in FIG. 2, but the thickness is also exemplary, and it can be designed according to specific circumstances. However, in order to play the roles of a black matrix and a heat dissipation sheet at the same time, the thickness of the graphene layer is required to be at least 1 µm or more.

After the graphene layer is formed, in the third step, an interlayer may be further formed by screen printing, for example, said interlayer may be made of photoresist resin. Especially for a flexible miniature LED component, when the flexible display is bent, it is effective to prevent the black matrix from pressing the interlayer structure of the miniature LED component by forming an interlayer. In the third step, the step of forming the interlayer is not compulsory, and it can be designed according to the situation of the lower substrate for docking which is provided by the downstream manufacturer of the miniature LED component. In a specific embodiment, the film thickness of the interlayer is below 40 µm, as shown in FIG. 2, and the film thickness should be understood to be merely exemplary.

In the fourth step, the step of rolling OCA optical glue on the bottom substrate on which the wire and the graphene layer are formed is performed. In a specific embodiment, optical grade OCA glue is used to adhere the contralateral miniature LED array substrate, and the film thickness of the OCA glue layer is below 40 µm, as shown in FIG. 2, the film thickness should be understood to be exemplary only.

As shown in FIG. 4, in the specific embodiment herein, since the material of the OCA optical glue used is an insulating epoxy resin glue material, the longitudinal heat source can be dissipated to the graphene material, thereby facilitating the heat dissipation. In addition, there is usually a protective film on the commercially available OCA optical glue, and thus there is a protective film on the upper substrate on which the OCA glue layer is pasted in the fifth step.

So far, the "integrated upper substrate" according to the invention is obtained by the method as shown in FIG. 4. The upper substrate can be directly provided to downstream manufacturers of the miniature LED component for the production of miniature LED components.

<Preparation of the Miniature LED Component According to the Invention>

As shown in FIG. 4, after obtaining the upper substrate for the miniature LED component, as shown in FIG. 5, it can be aligned and bonded with the lower substrate for the miniature LED component. As shown in FIG. 5, firstly, the lower substrate for the miniature LED component needs to be taken out, and it is aligned and bonded with the upper substrate. There is no specific restriction to the lower substrate of the miniature LED component, and it may be any one of various lower substrates produced by manufacturers in this field.

For example, the lower substrate may comprise switching transistors, driving transistors, data lines, bottom electrodes, ground connection lines, patterned bank layers, contact pads for driving the wafer FPC, and miniature LED devices emitting red light, the green light, or the blue light, as shown in FIG. 5.

Before bonding, if there is a protective film on the upper substrate according to the invention, you need to tear off the protective layer on the OCA glue layer first, and then performing the alignment bonding process of the upper substrate and the lower substrate. During the alignment process, the alignment can be assisted by different alignment marks on the upper and lower substrates.

After the alignment process is completed, the bonding process is performed by using a roller to obtain a semi-finished miniature LED component, which may also be referred to as an "open cell".

<Preparation of the Miniature LED Display Device According to the Invention>

Figure 6:
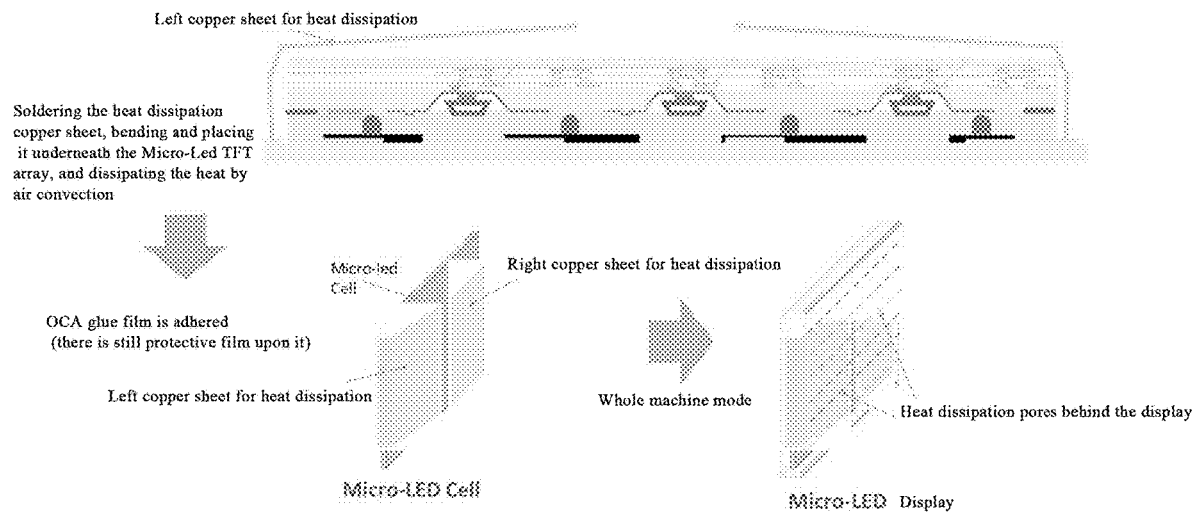
FIG. 6 shows a schematic flow chart of soldering the obtained upper and lower substrates of a miniature LED to obtain a miniature LED component.

According to the needs of the specific display device to be produced, a metal sheet for heat dissipation, such as a copper sheet, can be soldered on the obtained the miniature LED component as described in FIG. 5, wherein the metal sheet for heat dissipation is bent and placed on the lower substrate of the miniature LED TFT, and the heat is dissipated by air convection, as shown in FIG. 6.

Then, as shown in FIG. 6, a display device can be obtained. Although FIG. 6 shows the steps of soldering the metal sheet for heat dissipation, those skilled in the art can understand that the metal sheet for heat dissipation is not compulsory for the display device. For a large-scale display such as TV, it is often necessary to add the metal sheet for heat dissipation to further assist heat dissipation; however, for a small or medium-sized display such as a mobile phone or a tablet computer, the metal sheet for heat dissipation can be omitted.

In the above-mentioned miniature LED component and display device according to the invention, the manner of screen printing (also called screen printing) is adopted in forming the metal film layer and the graphene layer, but those skilled in the art can understand that the methods for forming a film or a layer is not limited to this, and examples thereof include ink-jet printing, sputtering and etching, spin coating, lamination, or printing method etc.

EXAMPLES

In the following examples, unless otherwise specified, percentages represent weight percentages.

Example 1: Light Transmittance of the Graphene Layer

75% by weight of artificial graphene powder filler (purchased from Hongming Graphite), 10% by weight of alkyl benzoic acid resin carrier (purchased from Yuanhong Co., Ltd.), and 5% by weight of NMP solvent (purchased from Songyi Chemical Co., Ltd.) are mixed, then adding 5% by weight of dispersant (purchased from BYK company, model: Anti-Terra 203), 2.5% by weight of adhesion promoter (purchased from Foshan Tuhaihui Chemical Materials Co., Ltd., model: HT901), and 2.5% by weight of defoamer (purchased from Chuangxin Trading, model: TSA750S), thereby obtaining a paste for screen printing; in this example, a copper film is used as the base material on which different thicknesses of paste is coated to obtain the graphene films with different thicknesses, i.e., the graphene films with thicknesses of 5 µm, 10 µm, 25 µm, 30 µm, and 45 µm.

For the different graphene films obtained above, the optical density (OD) value and light transmittance are measured (the OD value is detected by a color filter color inspection machine LCF-Series MCPD-9800; Otsuka Corporation, Japan).

Figure 9:
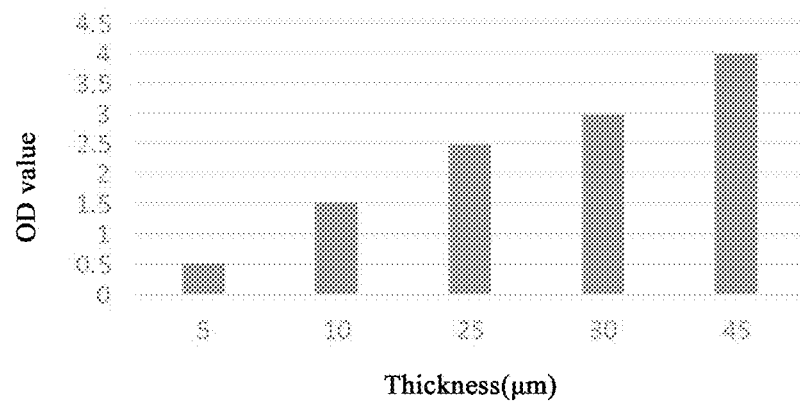
FIG. 9 shows the OD values of graphene layers with different thicknesses.

FIG. 9 and FIG. 10 respectively show the OD values of graphene layers with different thicknesses, and the light transmittance of the graphene layer at a film thickness of 30 µm. It can be seen that in the present invention, a graphene layer with a film thickness of 5 µm or more can be used as the black matrix. The results of Example 1 show that the graphene layer can be used as a black matrix, and it has a sufficiently low light transmittance.

Moreover, in addition to the specific weight percentages given in the above embodiments, and in addition to the specific percentages described above, the weight percentages of the components can be appropriately selected according to the following table to obtain graphene layers of different compositions.

| Materials | Weight Percentages | Sources |
| --- | --- | --- |
| Artificial graphene powder | 70%~90% | Hongming Graphite |
| Alkyl benzoic acid resin | 5%~10% | Yuanhong Co., Ltd. |

| Materials | Weight Percentages | Sources |
|---|---|---|
| NMP solvent | 5%~10% | Songyi Chemical Co., Ltd. |
| Dispersant | 5%~10% | BYK Corporation |
| Adhesion promoter | 5%~10% | Foshan Tuhaihui Chemical Material Co., Ltd. |
| Defoamer | 5%~10% | Chuangxin Trading |

Example 2: Preparation of Miniature LED Display

According to the manner shown in FIGS. 4-6, a miniature LED display is prepared, wherein PET is used as the bottom substrate, the OCA glue layer and the lower substrate are respectively the common OCA glue and the common lower substrate used by LCD panel manufacturers.

Example 3: Evaluation of Heat Dissipation Capacity of Miniature LED Display

Figure 11:
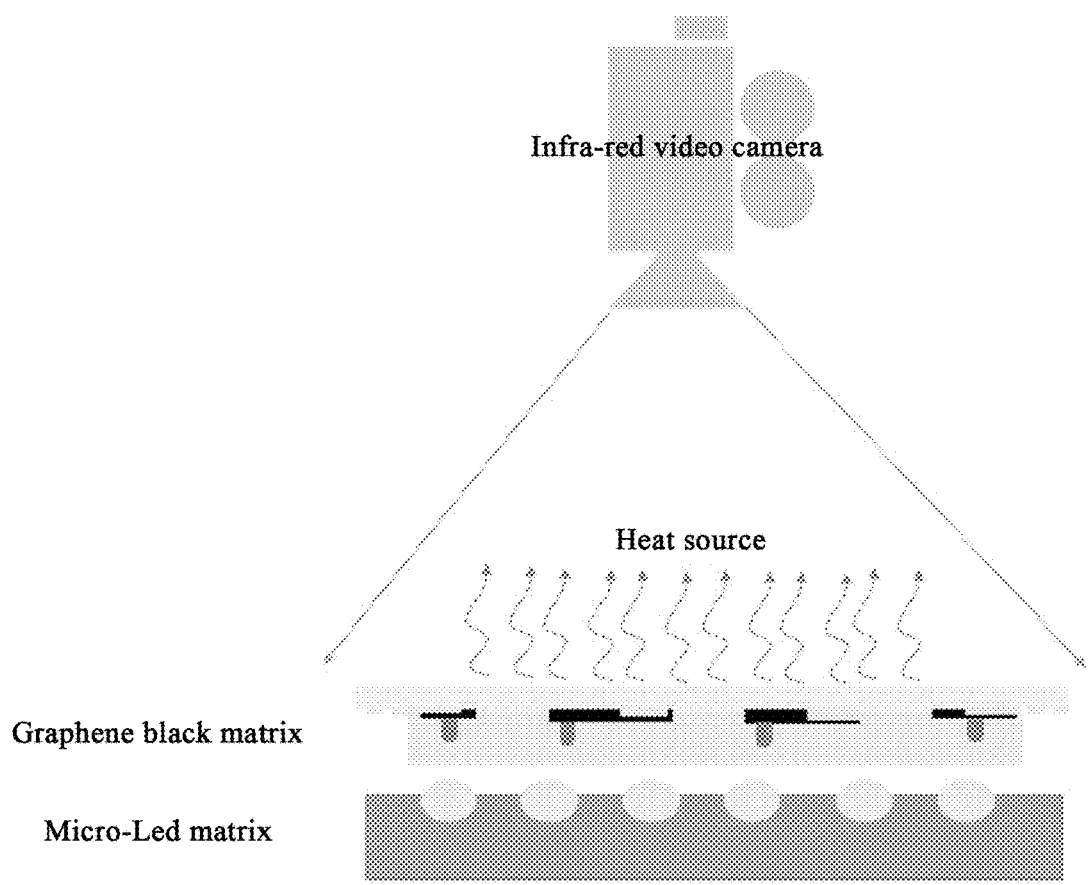
FIG. 11 shows a schematic diagram of the heat dissipation manner of the miniature LED component according to the invention.
Figure 12:
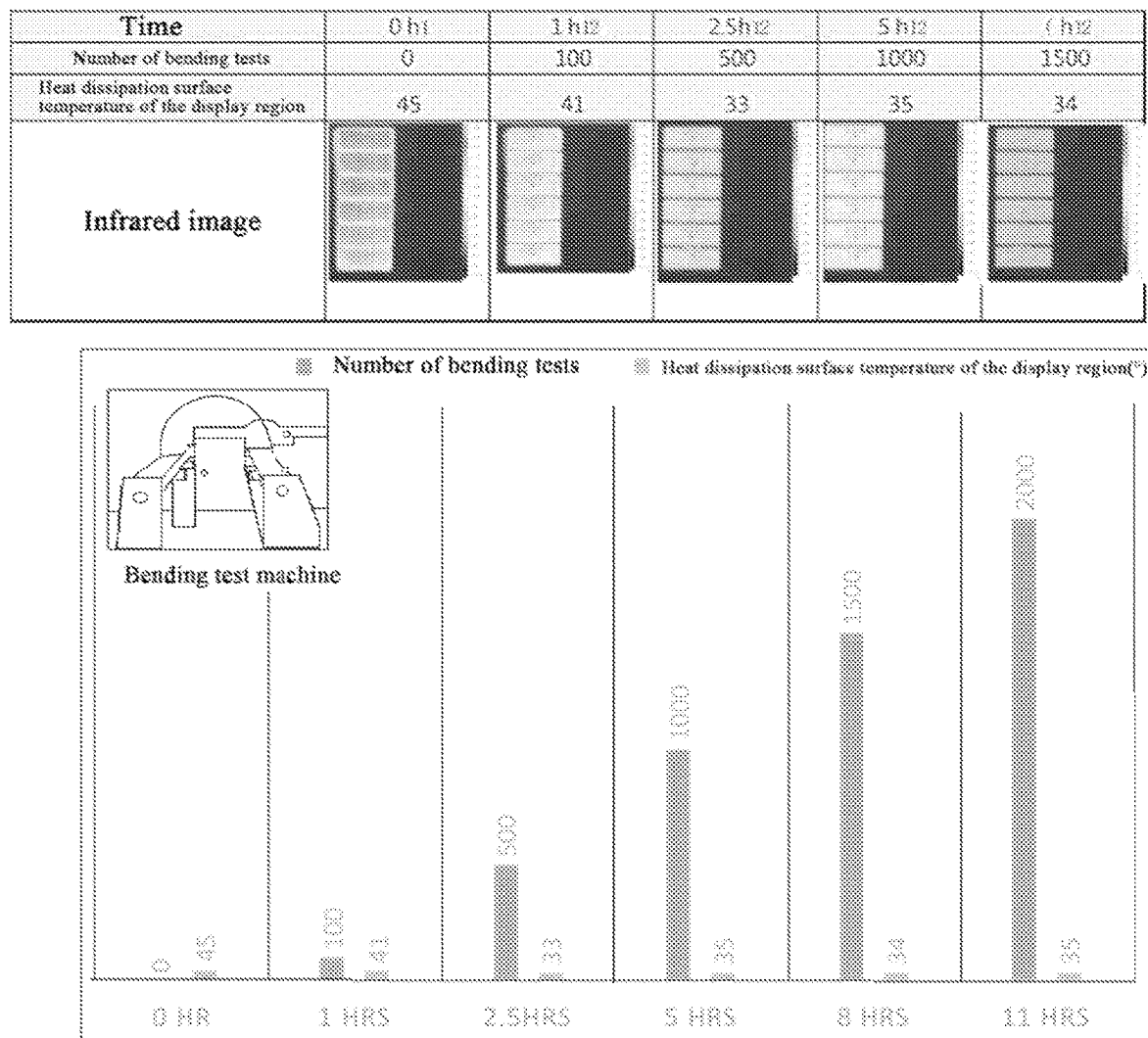
FIG. 12 shows the results of the bend detection experiment and heat dissipation experiment of the display according to the invention.

The LED display obtained in Example 2 is monitored by infrared camera, as shown in FIG. 11, then measuring the heat dissipation results of the display after a fixed number of bends. The test results are shown in FIG. 12, and it can be found that the display according to the invention has stable heat dissipation characteristics even if it is bent up to 2000 times.

The specifications of the LED crystal grain used in this example are as follows:
Pixel size: 0.0100 mm$^2$
Light output brightness:>250 cd/m$^2$

INDUSTRIAL APPLICABILITY

This invention provides an "integrated upper substrate" for use in a miniature LED display device, the substrate exists in the form of an integrated diaphragm and can be directly provided to downstream customers after the production; the customers can directly bond it to the lower substrate of a miniature LED array, and a semi-finished miniature LED component can be obtained after the alignment bonding process.

The upper substrate according to the invention has a graphene film, which has the functions of dissipating the heat of the LED and serving as a black matrix structure that must be used in a miniature LED display to improve optical contrast.

In addition, as for the preferred upper substrate of invention, a metal layer with a high thickness and heat storage at a specific location is designed for the component processor that drives hundreds of millions of miniature LED crystal grains, thereby facilitating the thermal energy dissipation.

In addition, the preferred upper substrate of invention is provided with an interlayer; during the winding process of a miniature LED component, especially a flexible LED component, the interlayer may prevent the upper substrate from impacting the lower substrates array of the miniature LED component, and disperse the downward pressure of the entire display.

The preferable upper substrate according to the invention is provided with a cross-alignment mark to be used before bonding with the lower substrate of a downstream manufacturer, and this mark can improve the alignment accuracy.

The present application accepts various modifications and alternative forms, and specific embodiments have been shown in the drawings by way of examples and have been described in detail in the present application. However, this application is not intended to be limited to the particular forms disclosed. On the contrary, this application is intended to include all modifications, equivalents, and alternatives within the scope of this application, and the scope of this application is defined by the appended claims and their legal equivalents.

The invention claimed is:

1. An upper substrate for a miniature LED component, comprising:
a bottom substrate;
a metal layer formed on the bottom substrate and having a pattern capable of covering a non-opening region of the lower substrate for the miniature LED component;
a graphene layer formed on the bottom substrate; and
a transparent adhesive layer formed on the bottom substrate to cover the metal layer and the graphene layer.

2. The upper substrate for a miniature LED component according to claim 1, wherein,
the graphene layer has an opening capable of exposing the light-transmitting region of the lower substrate for the miniature LED component, so as to serve as a black matrix of the miniature LED component.

3. The upper substrate for a miniature LED component according to claim 2, further comprising:
an interlayer formed on the graphene layer, the interlayer is in contact with the region other than the LED component and the wires of the lower substrate when being bonded to the lower substrate for the miniature LED component.

4. The upper substrate for a miniature LED component according to claim 3, wherein
the thickness of the metal layer at the position corresponding to the wafer of the lower substrate for the miniature LED component on the bottom substrate is thickened, or the width is widened.

5. The upper substrate for a miniature LED component according to claim 3, wherein
the thickness of the graphene layer is 5 μm or more, preferably 50 μm or less, more preferably 40 μm or less, and more preferably 30 μm or less.

6. The upper substrate for a miniature LED component according to claim 2, wherein
the thickness of the metal layer at the position corresponding to the wafer of the lower substrate for the miniature LED component on the bottom substrate is thickened, or the width is widened.

7. The upper substrate for a miniature LED component according to claim 6, wherein
the thickness of the graphene layer is 5 μm or more, preferably 50 μm or less, more preferably 40 μm or less, and more preferably 30 μm or less.

8. The upper substrate for a miniature LED component according to claim 2, wherein
the thickness of the graphene layer is 5 μm or more, preferably 50 μm or less, more preferably 40 μm or less, and more preferably 30 μm or less.

9. The upper substrate for a miniature LED component according to claim 1, further comprising:
an interlayer formed on the graphene layer, the interlayer is in contact with the region other than the LED component and the wires of the lower substrate when being bonded to the lower substrate for the miniature LED component.

10. The upper substrate for a miniature LED component according to claim 9, wherein the thickness of the metal layer at the position corresponding to the wafer of the lower substrate for the miniature LED component on the bottom substrate is thickened, or the width is widened.

11. The upper substrate for a miniature LED component according to claim 9, wherein
the thickness of the graphene layer is 5 μm or more, preferably 50 μm or less, more preferably 40 μm or less, and more preferably 30 μm or less.

12. The upper substrate for a miniature LED component according to claim 1, wherein
the thickness of the metal layer at the position corresponding to the wafer of the lower substrate for the miniature LED component on the bottom substrate is thickened, or the width is widened.

13. The upper substrate for a miniature LED component according to claim 12, wherein
the thickness of the graphene layer is 5 μm or more, preferably 50 μm or less, more preferably 40 μm or less, and more preferably 30 μm or less.

14. The upper substrate for a miniature LED component according to claim 1, wherein
the thickness of the graphene layer is 5 μm or more, preferably 50 μm or less, more preferably 40 μm or less, and more preferably 30 μm or less.

15. A miniature LED component, comprising:
the upper substrate according to claim 1, and
the lower substrate for the miniature LED component.

16. A display device, comprising:
the miniature LED component according to claim 15.

17. The display device according to claim 16, further comprising a metal sheet for heat dissipation.

18. A method for preparing an upper substrate for a miniature LED component, which includes the following steps:
forming a metal layer on a bottom substrate, wherein the metal layer has a pattern capable of covering a non-opening region of the lower substrate for the miniature LED component;
forming a graphene layer on the bottom substrate on which the metal layer is formed; and
forming a transparent adhesive layer on the bottom substrate on which the metal layer and the graphene layer are formed.

19. The method for preparing an upper substrate for a miniature LED component according to claim 18, further including:
thickening or widening the metal of the metal layer on the bottom substrate, wherein the metal of the metal layer is located at the position corresponding to the wafer of the lower substrate for the miniature LED component.

20. The method for preparing an upper substrate for a miniature LED component according to claim 18, further including:
forming an interlayer on the graphene layer, so that the interlayer is in contact with the region other than the LED component and the wires of the lower substrate for the miniature LED component when being bonded to the lower substrate for the miniature LED component.

* * * * *